(12) United States Patent
Veenstra et al.

(10) Patent No.: US 7,400,209 B2
(45) Date of Patent: Jul. 15, 2008

(54) OSCILLATOR CIRCUIT

(75) Inventors: Hugo Veenstra, Eindhoven (NL); Edwin Van Der Heijden, Eindhoven (NL); Wei Liat Chan, Eindhoven (NL)

(73) Assignee: NXP B.V., Eindhoven (NL)

( * ) Notice: Subject to any disclaimer, the term of this patent is extended or adjusted under 35 U.S.C. 154(b) by 88 days.

(21) Appl. No.: 10/545,653

(22) PCT Filed: Feb. 10, 2004

(86) PCT No.: PCT/IB2004/050095

§ 371 (c)(1),
(2), (4) Date: Aug. 16, 2005

(87) PCT Pub. No.: WO2004/050095

PCT Pub. Date: Sep. 2, 2004

(65) Prior Publication Data

US 2006/0226923 A1    Oct. 12, 2006

(30) Foreign Application Priority Data

Feb. 20, 2003  (EP)  ................... 03100401

(51) Int. Cl.
*H03B 1/00* (2006.01)

(52) U.S. Cl. .............. 331/177 V; 331/167; 331/36 C; 331/117 R; 331/46

(58) Field of Classification Search ............ 331/117 V, 331/117 FE, 117 R, 167, 36 C, 46
See application file for complete search history.

(56) References Cited

U.S. PATENT DOCUMENTS

| 4,810,976 A |   | 3/1989 | Cowley et al. |
| 5,949,295 A | * | 9/1999 | Schmidt ................. 331/117 R |
| 6,249,190 B1 |  | 6/2001 | Rozenblit et al. |

FOREIGN PATENT DOCUMENTS

WO    WO 02/065632 A1    8/2002

OTHER PUBLICATIONS

A CMOS 10 GHz Voltage Controlled LC-Oscillator with Integrated high-Q inductor; Wouter De Cock & Michiel Steyaert.
Design of a 1.6-mW LC-tuned VCO for 2.4GHz applications in 0.18-um RF CMOS technology. Stein Erik Weberg.

\* cited by examiner

*Primary Examiner*—Arnold Kinkead
(74) *Attorney, Agent, or Firm*—Peter Zawilski

(57) ABSTRACT

Present invention relates to an oscillator circuit comprising: resonator means (102) and, first and second emitter followers (116, 118) being symmetrically coupled to the resonator means and been connected to further emitter followers (120, 122) for providing capacitive loading.

15 Claims, 9 Drawing Sheets

OSCILLATOR CIRCUIT

Present invention relates to the field of oscillator circuits, and more particularly without limitation to the field of high frequency oscillator circuits having oscillation frequencies in the GHz range.

A number of oscillator circuits operating in the GHz range are known from the prior art. An oscillator circuit having a tuning range of 14 GHz to 21.5 GHz is known from K. Ettinger, M. Bergmair, H. Pretl, W. Thomann, J. Fenk, R. Weigel, "An Integrated 20 GHz SiGe Bipolar Differential Oscillator with High Tuning Range", Proceedings of the 2000 Bipolar/BiCMOS Circuits and Technology Meeting (BCTM), Minneapolis, 2000, pp. 161-163. ISBN 0-7803-6384-1. This oscillator circuit is realised in SiGe bipolar technology and features a tank consisting of on-chip strip line inductors and the parasitic capacitances of the oscillator transistors. An output buffer is inductively coupled to the tank. The oscillator core consists of an LC-tank and a cross-coupled differential amplifier. The cross-coupled pair provides the negative resistance to compensate for the resistive losses of the tank. One of the disadvantages of this oscillator circuit is that the negative resistance provided by the cross-coupled differential amplifier suffices only for frequencies up to 21.5 GHz.

A similar high frequency oscillator, which is realised in CMOS technology is known from C. De Ranter and M. Steyaert, "A 0.25 µm CMOS 17 GHzVCO" in ISSCC Digest of Technical Papers, pp. 370-371, February 2001. This oscillator circuit has also a LC-tank based voltage controlled oscillator having a cross-coupled transistor pair to cover the power loss in the resistors and coil.

A further voltage controlled LC-oscillator with integrated high-Q inductor based on this design is known from http://www.esscirc.org/esscirc2001/proceedings/data/169.pdf.

This circuit operates at a frequency of up to 10 GHz. Still another voltage controlled LC-tuned oscillator for 2.4 GHz applications is known from http://eesof.tm.agilent.com/pdf/nordic_vlsi.pdf.

Examples for other prior art oscillator circuits are shown in U.S. Pat. No. 4,810,976, U.S. Pat. No. 6,249,190 B1 and WO 02/065632A1. Again cross-coupled transistor pairs are used for un-damping the voltage controlled oscillator core.

It is a common disadvantage of prior art high frequency oscillators that the frequency range is limited by a cross-coupled transistor pair which only provides sufficiently negative resistance up to a certain frequency. This frequency-limit depends on the technology used e.g. 25 GHz in case of QUBiC4G.

Therefore a need exists to provide an improved oscillator circuit, which enables to increase the prior art frequency-limit. The invention is defined by the independent claim. Dependent claims define advantageous embodiments.

The present invention provides for an oscillator circuit having first and second emitter followers being symmetrically coupled to a resonator. The emitter followers have a capacitive load. The capacitive loading of the transistors of the emitter followers results in a negative real value of the input impedance, which has the effect of un-damping the resonator. Hence, usage of a cross-coupled transistor pair is avoided.

Preferably the resonator is realized as an LC resonator. For example the resonator can be realized by means of an inductor and a varactor with a tuning voltage for frequency tuning. In series with this varactor, a high value capacitor for low series resistance is added. By doing so, the anode of the varactor is DC grounded via a high-ohmic series resistance and the cathode is tuneable from zero volt to supply voltage VCC. The bottom-plate of the varactor, which parasitics are high, is common-mode. This topology has the largest possible tuning range within the supply voltage. The varactor is biased between zero bias to reverse bias.

In accordance with a preferred embodiment of the invention the resonator circuit is realized as a common cathode tank circuit. Alternatively the resonator circuit is a common anode tank circuit.

In accordance with a preferred embodiment of the invention, the capacitive loading of the first and second emitter followers is provided by a second emitter follower pair. This way two pairs of cascaded emitter followers are provided.

Alternatively or in addition a capacitor is inter-coupled between the first and second emitter followers to provide the capacitive load.

In accordance with a further preferred embodiment of the invention, a level shifter is coupled between the supply voltage and the resonator. The level shifter can be realized by one or more diodes. A diode acts as a level shift as it enables a larger signal swing across the resonator before the emitter followers' base-collector junction starts to clamp the signal on the resonator.

The present invention is particularly advantageous in that it enables to realize a high-frequency oscillator circuit other than by means of a cross-coupled transistor pair. In particular, the present invention enables to realize an oscillator circuit having a low- and a high frequency-limit, depending on the technology used e.g. above 20 GHz and up to 40 GHz in case of QUBiC4G. This is particularly advantageous for applications like phase-locked loops, up-converters, down-converters, mixers and signal generators to name a few.

Other advantages obtained using the present invention are as follows:

- the phase noise improves since noise contributions from the cross-coupled transistor pair disappear;
- the required chip area is reduced;
- the high signal swing at the output of the oscillator circuit is enabled due to the high capacitive load of the emitter followers;
- the tuning range of the oscillator circuit increases significantly as less parasitics are connected through the resonator circuit.

In the following preferred embodiments of the invention will be described in greater detail by making reference to the drawings in which:

FIG. 1 is a block diagram of a first embodiment where the capacitive load is provided by a second emitter follower pair, FIG. 2 is a block diagram of a second embodiment of the invention with an additional capacitor coupled between the emitter followers, FIG. 3 is illustrative of a parallel equivalent input impedance of the output buffer, FIG. 4 is illustrative of a parallel equivalent RC-circuit of the resonator (inductor and varactor), and FIG. 5 shows transient results in the tuning range from 39.4 GHz up to 43.1 GHz, and FIG. 6 shows the phase noise results at 40 GHz.

Figure 1:
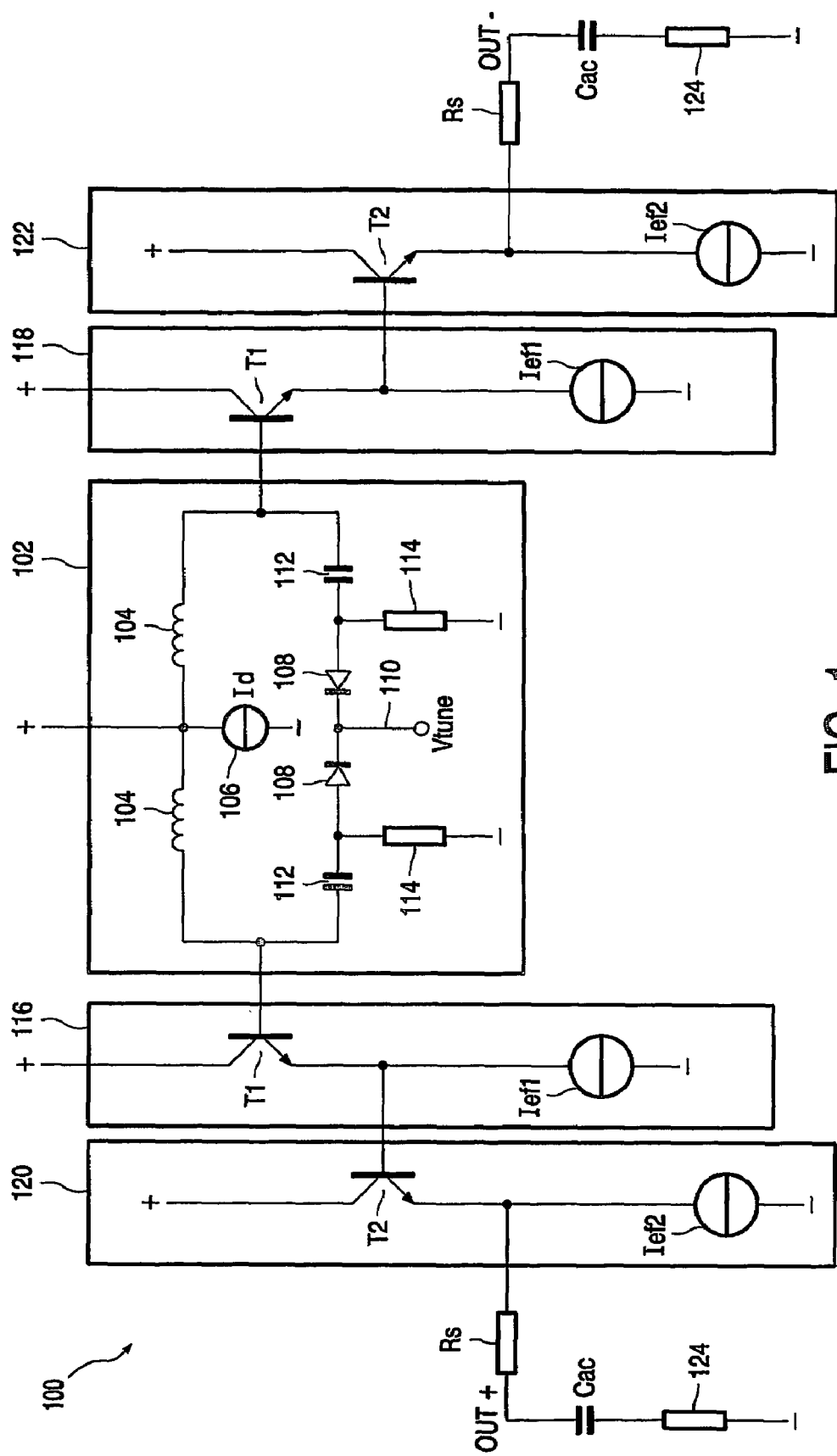

FIG. 1 shows an oscillator circuit 100 having a resonator 102. In the example considered here, the resonator 102 has an inductor 104 which is symmetrically coupled to a current source 106 providing a current Id; further inductor 104 is symmetrically coupled to the supply voltage. Resonator 102 has varactor 108 with a control terminal 110 to apply a tuning voltage Vtune for frequency tuning. Capacitors 112 are coupled in series with varactor 108. Preferably capacitors 112 have a high value and thus a low series resistance. Hence, the anode of the varactor 108 is DC grounded via a high-ohmic series resistances 114 and the cathode, i.e. the control terminal 110, is tuneable from zero volt to supply voltage. The bottom-plate of the varactor is common-mode. This topology allows the largest possible tuning range within the supply voltage. The resonator 110 is of the common cathode type such that the anodes of the resonator 102 are coupled to emitter followers 116 and 118, respectively. Emitter followers 116 and 118 have a symmetric design and both comprise a transistor T1 and a current source Ief1. The bases of the transistors T1 of the emitter followers 116 and 118 are coupled to the anodes of the resonator 102. Capacitive loading of the emitter followers 116 and 118 is provided by emitter followers 120 and 122. Again emitter followers 120 and 122 are designed symmetrically and each have a transistor T2 and current source Ief2. The base of transistor T2 of emitter follower 120 is coupled to the emitter of transistor T1 of emitter follower 116; likewise the base of transistor T2 of emitter follower 122 is coupled to the emitter of transistor T1 of emitter follower 118. The capacitive loading of the transistors T1 provided by the emitter followers 120 and 122 result in a negative real part of the input impedance seen from the resonator 102. This negative real part of the input impedance is used to un-damp the resonator 102. Resistors Rs are used to realize single-ended output impedances to provide the output terminals OUT+ and OUT−. For example each one of the resistors Rs has an impedance of 50 ohm. The outputs OUT+ and OUT− are coupled by means of capacitors Cac to output loads 124 which preferably are also 50 ohm.

Figure 2:
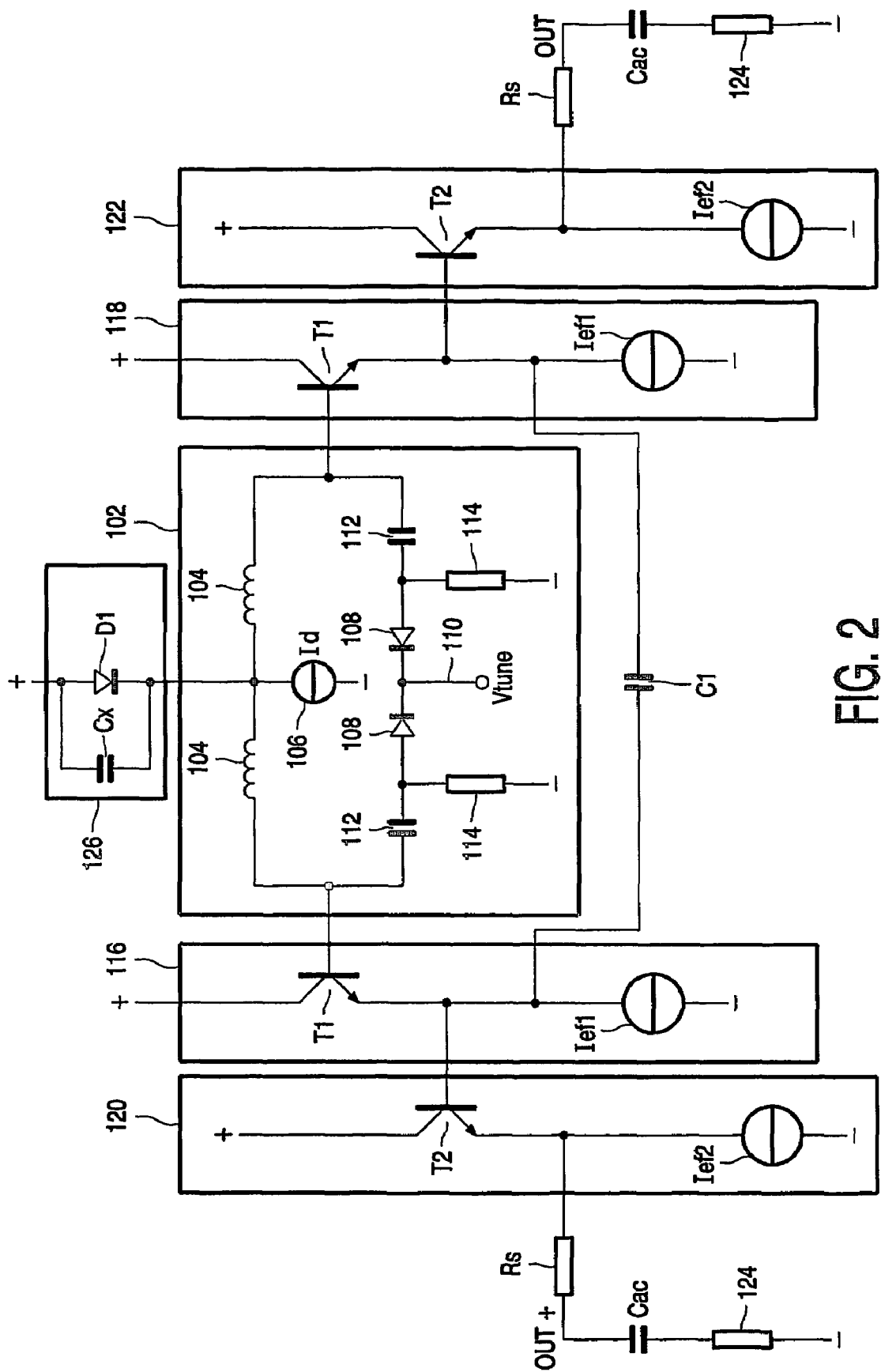

FIG. 2 is a block diagram of an alternative embodiment. Like elements in FIGS. 1 and 2 are designated by the same reference numerals. Like in the embodiment of FIG. 1 the resonator 102 of the embodiment of FIG. 2 is coupled to cascaded emitter followers 116, 120 and 118,122. Emitter follower 120 provides a capacitive load for emitter follower 116; likewise emitter follower 122 provides a capacitive load to emitter follower 118. In the embodiments considered here, capacitor C1 is added to increase the capacitive load of the emitter followers 116 and 118. Capacitor C1 is connected between the emitters of transistors T1. If the capacitance of capacitor C1 is sufficiently large it is also possible to leave out the emitter followers 120 and 122 and to directly connect the resistors Rs to the emitters of transistors T1. Further there is a level shifter circuit 126 which is symmetrically coupled between the supply voltage and the resonator 102. Level shifter circuit 126 has a diode D1 and a capacitor Cx which is connected in parallel to the diode D1. Diode D1 acts as a level shift and is used to allow a large up to two diodes signal swing across the resonator 102 before the base-collector junction of the transistors T1 starts to clamp the signal on the resonator 102. Additional diodes can be added in series with diode D1 to further increase the maximum attainable signal swing. The additional noise of diode D1 is filtered by capacitor Cx, while its noise may also be reduced by increasing the DC current through diode D1 using current source Id.

The negative real part of the input impedance of the output buffer, which is due to the capacitive loading of the emitter followers 116 and 118 has a slope of $1/(f^2)$:

$$R_P = \frac{1}{\text{real}(Y_{in})} = \frac{-\omega_r}{\omega^2 C_l}$$

Figure 3:
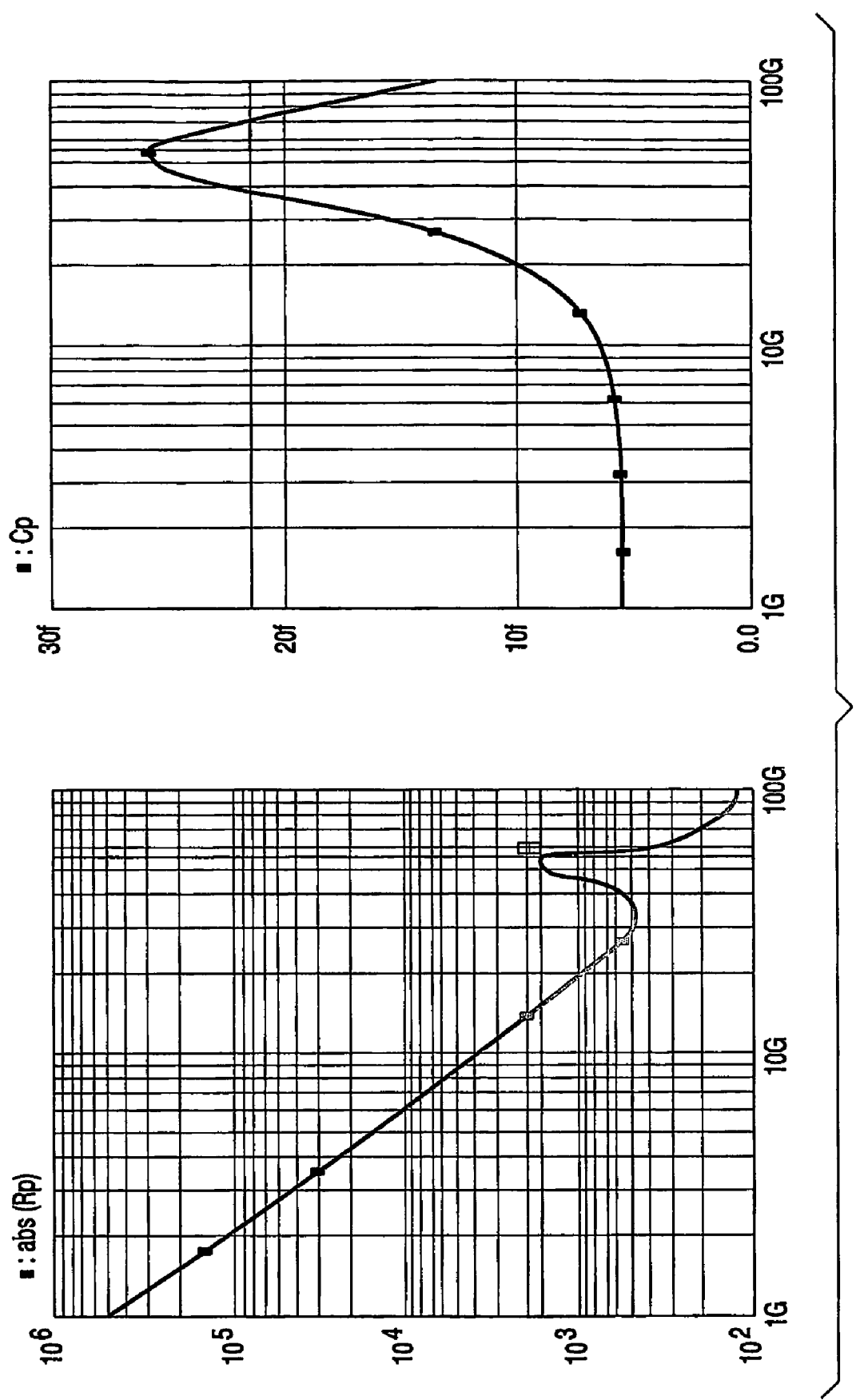

With $C_1$ the input capacitance of the emitter followers 120 and 122 and $R_p$ the differential parallel input resistance seen from the resonator 102. Because this resistance must be lower in absolute value than the positive resistance from the resonator 102 to start oscillation, this topology is particularly useful above frequencies where the negative resistance is low enough. In prior art tank circuits usually the quality-factor lowers at increasing frequency due to the fixed series resistance of the varactor and the increasing series resistance of the inductor due to skin-effect. Because the parallel resistance of the resonator 102 has a less steep slope than $1/(f^2)$, the new topology is useful at higher frequencies, depending on the technology used e.g. above 20 GHz and up to 40 GHz in case of QUBiC4G. The parallel equivalent input impedance of the output buffer is shown in FIG. 3. At 40 GHz, the equivalent RC-circuit is −504Ω in parallel with 21 fF enabling a practical implementation of a 40 GHz VCO in a Philips QUBiC4G process. At 56 GHz, the resistance is not negative anymore, placing a new frequency limit at 56 GHz for an LC-VCO in QUBiC4G with this new topology.

Figure 4:
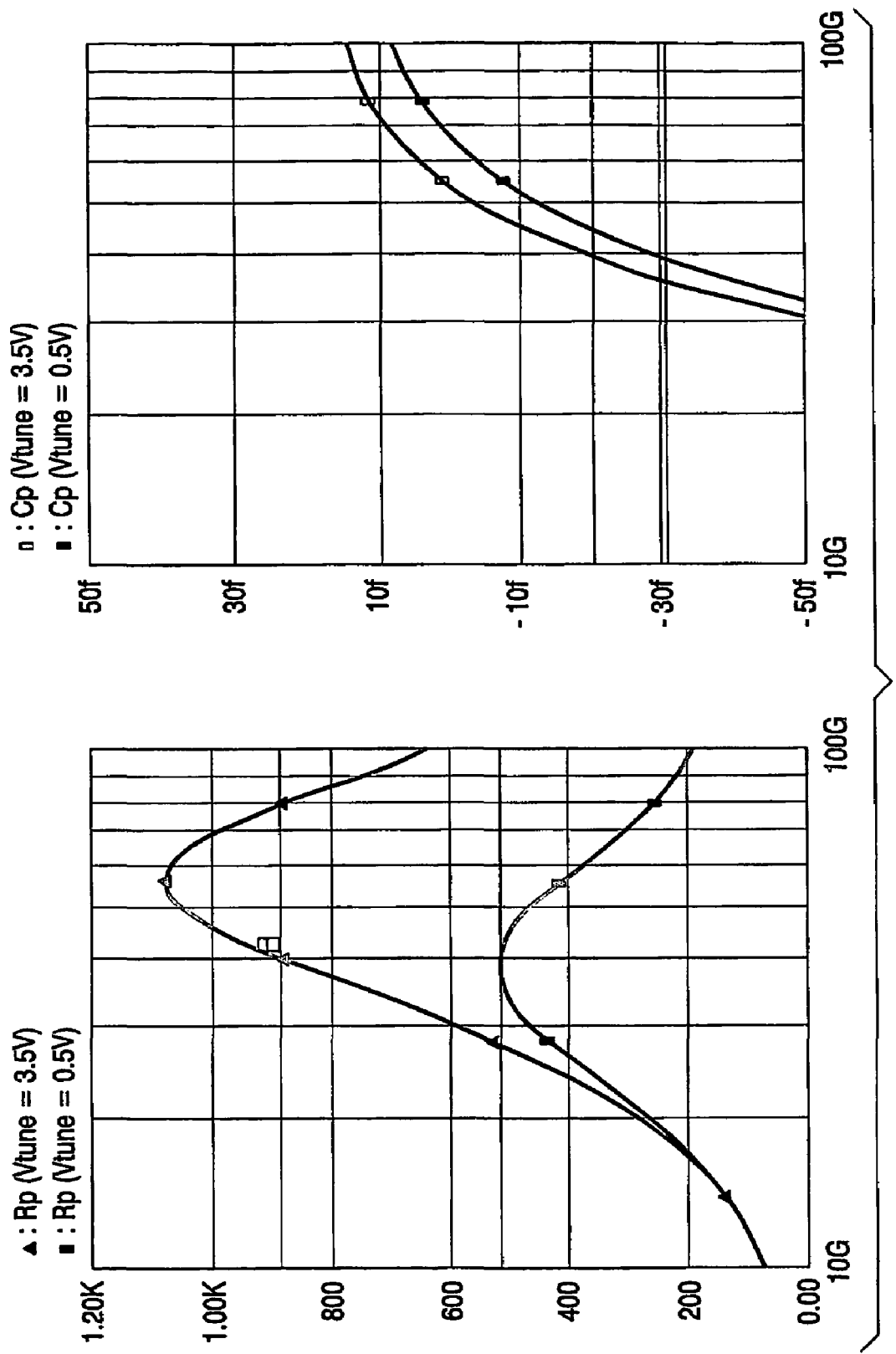
Figure 5:
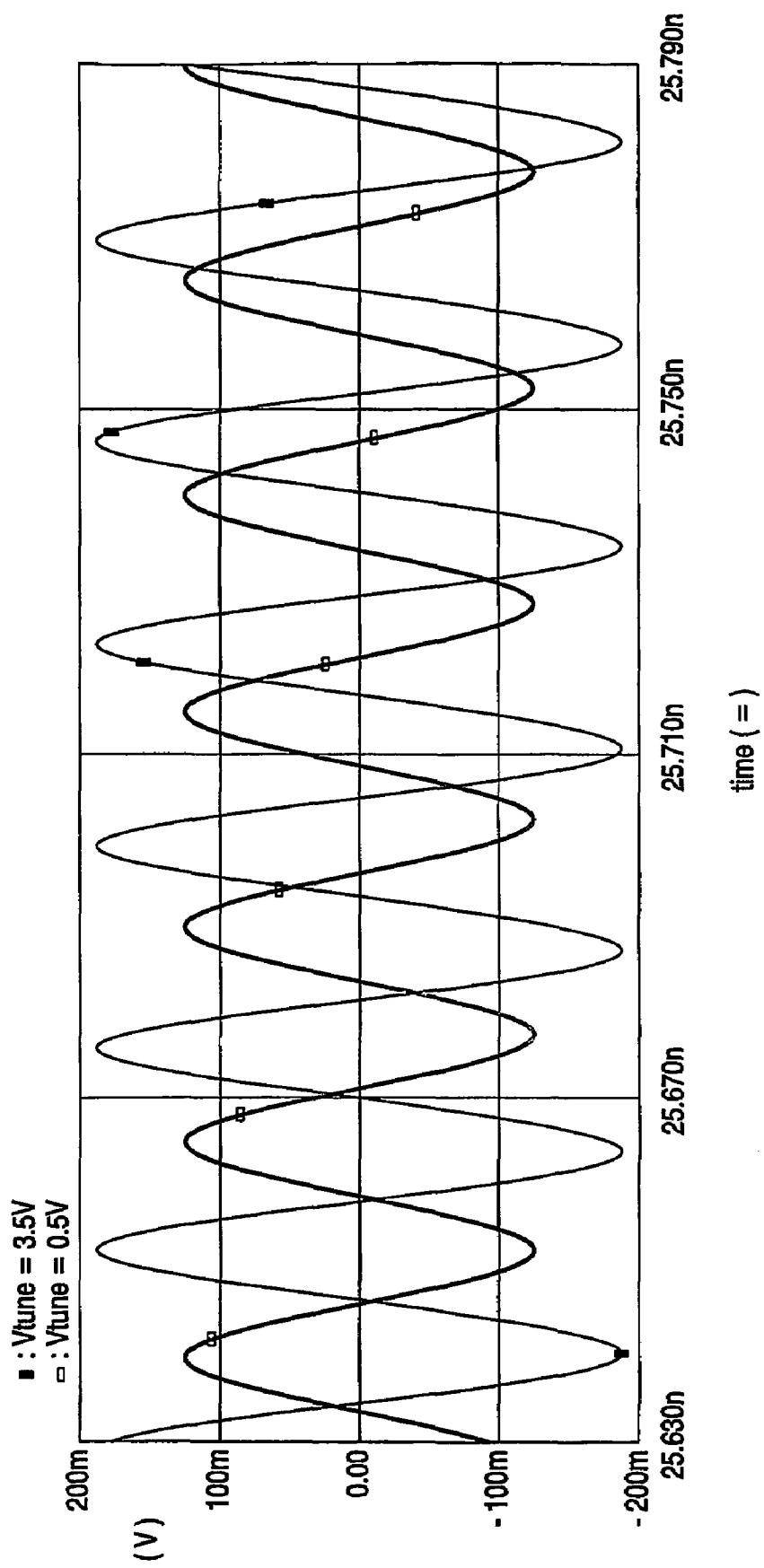
Figure 6:
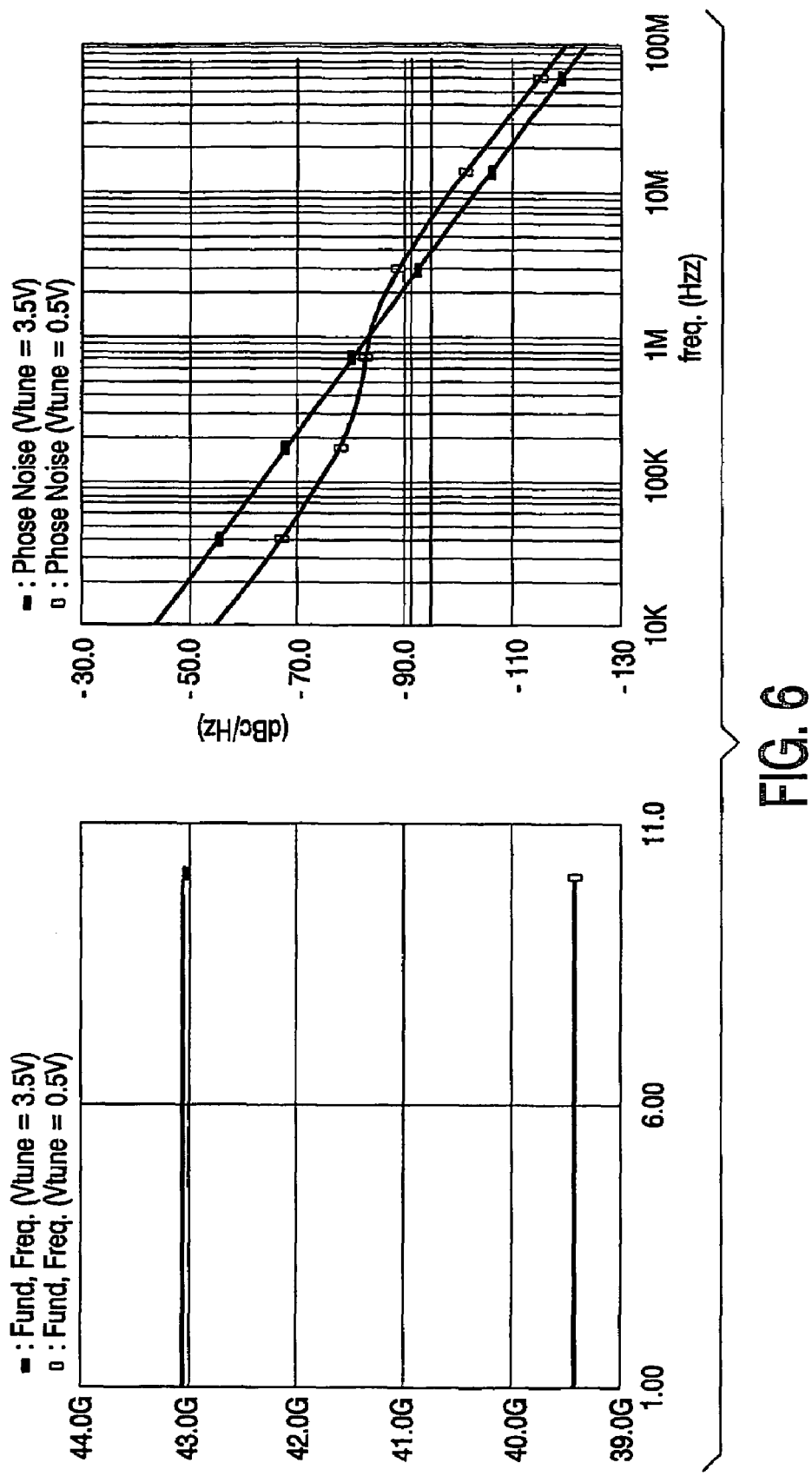

FIG. 4 shows the parallel equivalent RC-circuit of the practical implementation of resonator 102 in QUBiC4G. The negative resistance of −504Ω in parallel to this resonator 102 (from the buffer) is adequate to start oscillation at tuning voltages above 0.5 V (where the positive parallel resistance from the tank is +526Ω). The transient results of the LC-VCO with the new topology of FIG. 2 are shown in FIG. 5. The phase noise results are shown in FIG. 6. The tuning range is from 39.4 GHz up to 43.1 GHz (tuning from 0.5 to 3.5 V). The phase noise is worst-case (at 0.5 V tuning voltage) −92 dBc/Hz at 4 MHz. The circuit principles can also be implemented using PNP transistors instead of NPN transistors. The output buffer can be implemented as class-A/B if both NPN and PNP transistors are available. Also NMOS and/or PMOS transistors may be used, as long as the first stage of the buffer, i.e. emitter followers 116, 118, provides 90 degrees phase shift and remains (partly) capacitively loaded.

The topologies of FIGS. 1 and 2 have a number of advantages, some of which are summarized below:

Un-damping via the output buffer, with a given tank-circuit, always results in an increase in tuning range and a higher oscillation frequency. These two advantages are due to the reduced capacitive loading to the resonator when comparing a cross-coupled bipolar circuit in a prior art topology versus an output buffer comprising two emitter followers in cascade;

The invention enables to avoid the cross-coupled bipolar pair ($-2/g_m$). This was the limiting factor in frequency, because the negative resistance has a certain frequency-limit where the resistance becomes positive. This frequency-limit is lower than for the topology of FIGS. 1 and 2;

For a fixed tank-circuit, the phase noise result is always better for the new topology, comparing to the prior art topology, because noise sources from the cross-coupled pair are not present anymore;

Because the output buffer of FIGS. 1 and 2 comprises two emitter followers in cascade, there is no signal swing in the collector, which allows a higher swing. In prior art designs, a degenerated differential pair is usually added as a first stage in the buffer to have a high-ohmic resistance in parallel to the tank. For that stage, the attenuation is high, resulting in a lower voltage swing for an equivalent tank;

Omitting the cross-coupled pair reduces the power dissipation of the VCO.

Figure 7:
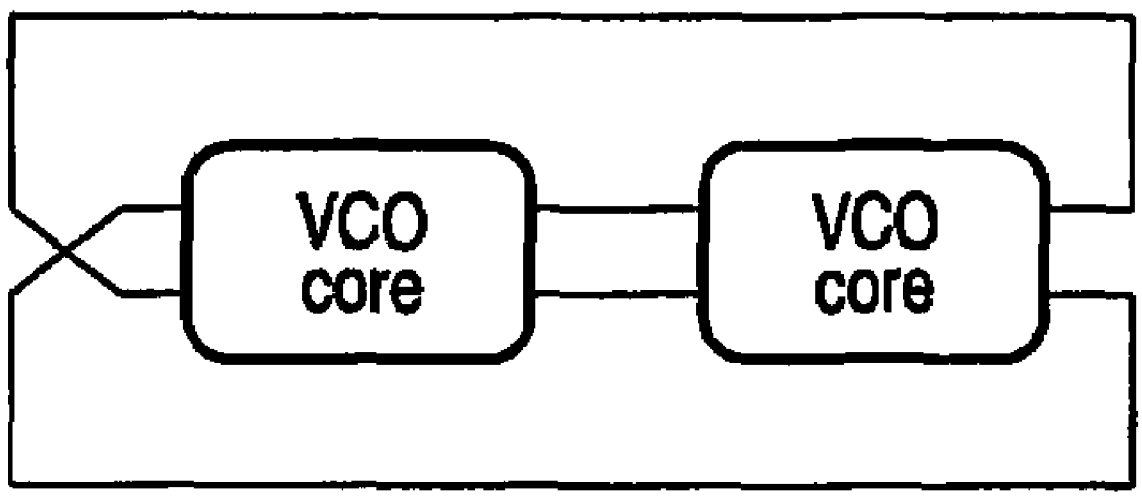
FIG. 7 shows a block diagram of a quadrature oscillator.

FIG. 7 shows a block diagram of a quadrature oscillator. Quadrature signal generation can be implemented in several ways. For low phase noise, usually resonator (LC)-type VCOs are used as building block Using two LC-VCO cores plus some means to couple them, quadrature signal generation is implemented. In FIG. 7, this principle for IQ eneration is shown. The two VCO cores are substantially identical. Both are assumed to generate a differential output signal. One cross coupling in the loop implements 180° phase shift; each of the cores provides 90° phase shift. Several implementations for LC-type VCO cores are known. The core uses an LC tank circuit as previously described.

Figure 8:
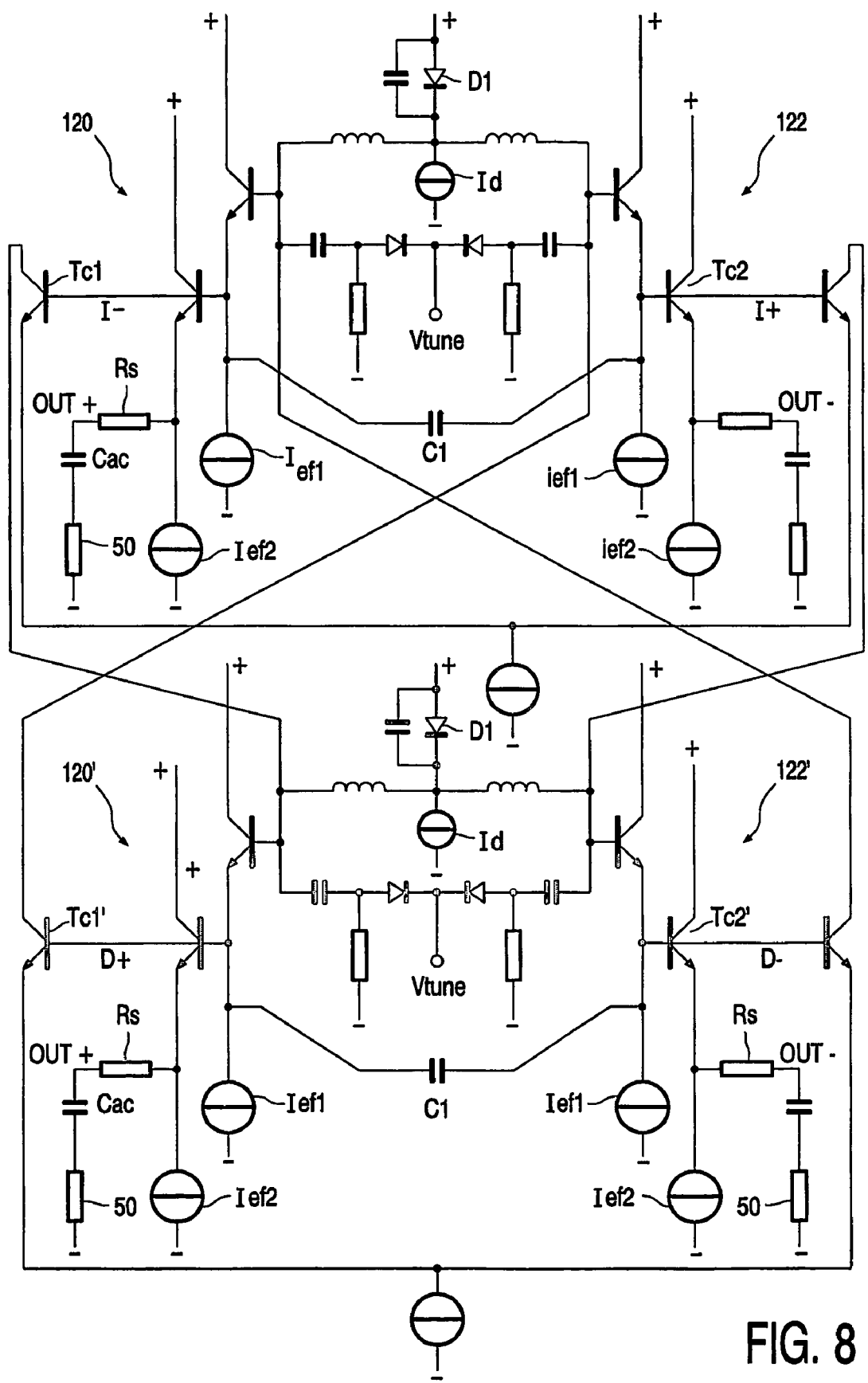
FIG. 8 shows a quadrature oscillator using a parallel coupling, according to an embodiment of the invention.

FIG. 8 shows a quadrature oscillator using a parallel coupling, according to an embodiment of the invention the first oscillator circuit comprises a first pair of transistors $T_{c1}$, $T_{c2}$ and the second oscillator circuit comprises a second pair of transistors $T_{c1}'$, $T_{c2}'$ coupled to the respective third emitter follower 120; 120' and the respective fourth emitter follower 122; 122'. Collectors of the first pair of transistors $T_{c1}$, $T_{c2}$ are coupled to the tank circuit included in the second oscillator circuit and collectors of the second pair of transistors $T_{c1}'$, $T_{c2}'$ are crossed coupled to the tank circuit of the first oscillator circuit. A drawback of the parallel implementation is the increased tank load due to the connection from the coupling transistors $T_{c1}$, $T_{c2}$ and $T_{c1}'$, $T_{c2}'$ to the LC-tank In the figure, the bases of the coupling transistors may also be coupled to the emitters of 120, 122; 120', 122'.

Figure 9:
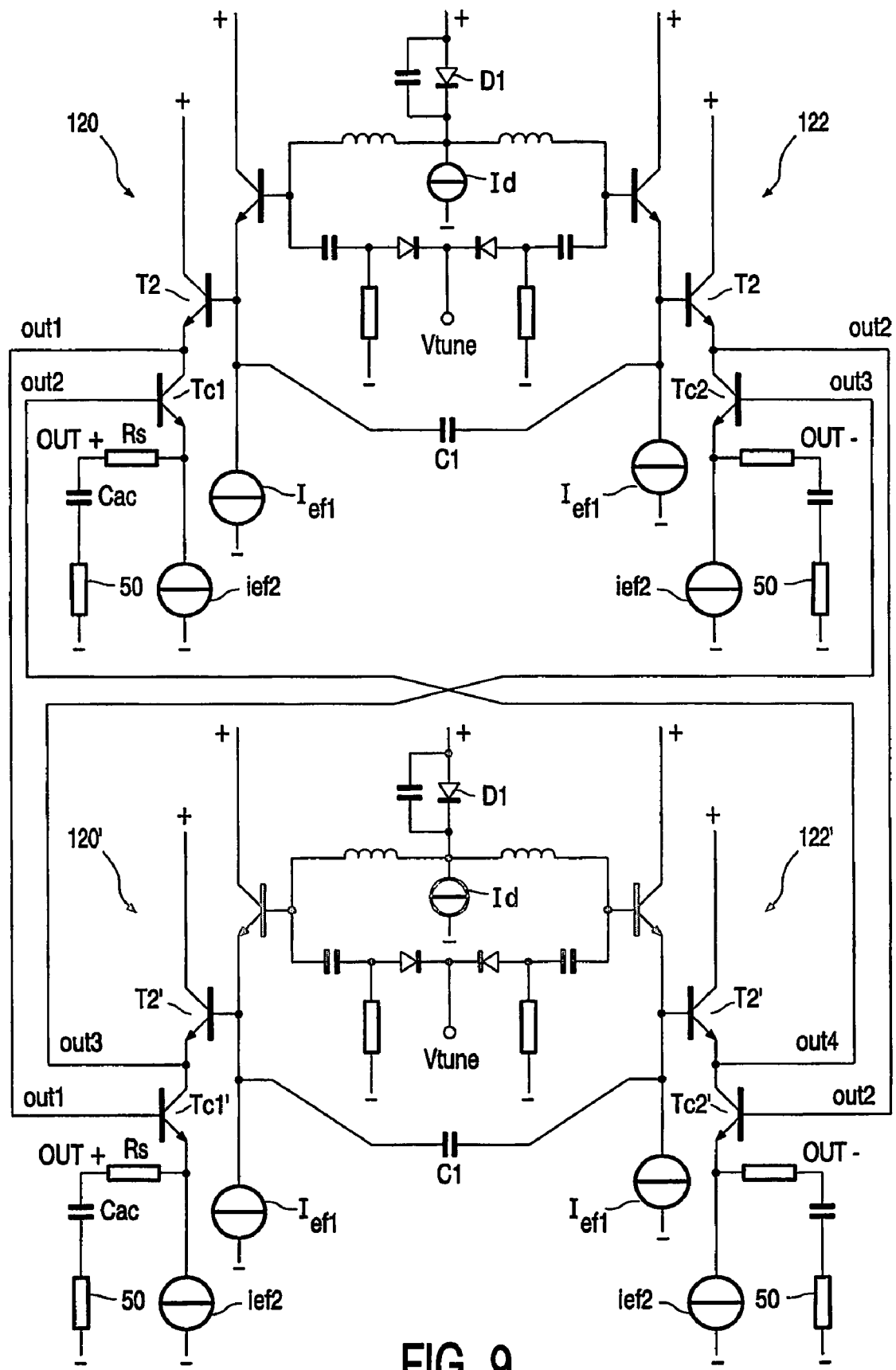
FIG. 9 shows a quadrature oscillator using a serial coupling, according to another embodiment of the invention.

FIG. 9 shows a quadrature oscillator using a serial coupling, according to another embodiment of the invention. The first oscillator circuit comprises a first pair of transistors $T_{c1}$, $T_{c2}$ and the second oscillator circuit comprises a second pair of transistors $T_{c1}'$, $T_{c2}'$ coupled to the third emitter follower 120, 122 and respective fourth emitter follower 120', 122'. Collectors of the first pair of transistors $T_{c1}$, $T_{c2}$ are coupled to respective bases of the second pair of transistors $T_{c1}'$, $T_{c2}'$. Collectors of the second pair of transistors $T_{c1}'$, $T_{c2}'$ are crossed-coupled to respective bases of the first pair of transistors $T_{c1}$, $T_{c2}$. The series implementation for a quadrature oscillator is preferred, because the loading of the LC-tank is reduced. Besides, the total bias current does not need to be increased, because of the series connection of the coupling transistors. The coupling transistors $T_{c1}$, $T_{c2}$; $T_{c1}'$, $Tc_{c2}'$ share the bias current Ief2 of the respective emitter followers 120, 122; 120', 122'.

The embodiments refer to implementations in bipolar technology but the inventive concept may be applied mutatis-mutandis to other technologies as e.g. GaAs, SiGe, CMOS, etc. As a consequence the terminals base, emitter and collector correspond to gate, source, drain, respectively.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features.

REFERENCE NUMERALS

100 oscillator circuit
102 resonator
104 inductor
106 current source
108 varactor
110 control terminal
112 capacitor
114 resistance
116 emitter follower
118 emitter follower
120 emitter follower
122 emitter follower
124 output load
126 level shifter circuit

The invention claimed is:

1. An oscillator circuit comprising: resonator means and, first and second emitter followers being symmetrically coupled to the resonator means and having a capacitive load, thereby providing negative resistance to overcome losses of the resonator means; wherein for each of the first and second emitter followers, an input signal of the emitter follower and an output signal of the emitter follower are uncoupled from one another.

2. The oscillator circuit of claim 1, the resonator being an LC resonator.

3. The oscillator circuit of claim 1, the resonator being a voltage controlled resonator.

4. The oscillator circuit of claim 3, the resonator having a varactor with a control voltage input for frequency tuning.

5. The oscillator circuit of claim 4, a capacitor being coupled to the varactor in series and a bottom-plate of the varactor being common-mode.

6. The oscillator circuit of claim 1, the resonator circuit being a common cathode tank circuit.

7. The oscillator circuit of claim 1, the resonator circuit being a common anode tank circuit.

8. The oscillator circuit of claim 7, further comprising a third emitter follower and a fourth emitter follower, the first and the third emitter followers being cascaded and the second and the fourth emitter followers being cascaded.

9. The oscillator circuit of claim 1, a capacitor being coupled between the first and second emitter followers.

10. The oscillator circuit of claim 1, further comprising level shifter means coupled between a supply voltage and the resonator means.

11. The oscillator circuit of claim 10, the level shifter means comprising at least one diode.

12. A quadrature oscillator comprising a first oscillator circuit as claimed in claim 8 crossed-coupled to a second oscillator circuit claim 8.

13. A quadrature oscillator as claimed in claim 12, wherein the first oscillator circuit comprises a first pair of transistors and the second oscillator circuit comprises a second pair of transistors coupled to the respective third emitter follower and the respective fourth emitter follower, collectors of the first pair of transistors being coupled to the rank circuit included in the second oscillator circuit and collectors of the second pair of transistors being crossed coupled to the tank circuit of the first oscillator circuit.

14. A quadrature oscillator as claimed in claim 12, wherein the first oscillator circuit comprises a first pair of transistors and the second oscillator circuit comprises a second pair of transistors coupled to the third emitter follower and respective fourth emitter follower, collectors of the first pair of transistors being coupled to bases of the second pair of transistors collectors of the second pair of transistors being crossed-coupled to bases of the first pair of transistors.

15. An electronic device such as a phase-locked loop, an up-converter, down-converter, mixer or signal generator comprising an oscillator circuit of claim 1.

\* \* \* \* \*